United States Patent
Abe et al.

(10) Patent No.: US 6,936,490 B2
(45) Date of Patent: Aug. 30, 2005

(54) SEMICONDUCTOR WAFER AND ITS MANUFACTURING METHOD

(75) Inventors: Yoshihisa Abe, Sagamihara (JP); Shunichi Suzuki, Hadano (JP); Hideo Nakanishi, Hadano (JP); Kazutaka Terashima, Ebina (JP); Jun Komiyama, Hadano (JP)

(73) Assignee: Toshiba Ceramics Co, Ltd., Tokyo (JP)

( * ) Notice: Subject to any disclaimer, the term of this patent is extended or adjusted under 35 U.S.C. 154(b) by 0 days.

(21) Appl. No.: 10/432,597

(22) PCT Filed: Sep. 5, 2002

(86) PCT No.: PCT/JP02/09035

§ 371 (c)(1),
(2), (4) Date: Jun. 3, 2003

(87) PCT Pub. No.: WO03/023095

PCT Pub. Date: Mar. 20, 2003

(65) Prior Publication Data

US 2004/0053438 A1 Mar. 18, 2004

(30) Foreign Application Priority Data

| Sep. 6, 2001 | (JP) | ................................. | 2001-270242 |
| Jan. 28, 2002 | (JP) | ................................. | 2002-017875 |
| Jun. 12, 2002 | (JP) | ................................. | 2002-171382 |
| Jun. 28, 2002 | (JP) | ................................. | 2002-189910 |

(51) Int. Cl.[7] ............................................. H01L 21/00
(52) U.S. Cl. ........................ 438/46; 438/93; 438/105; 438/285
(58) Field of Search ................... 438/99, 46, 47, 438/93, 105, 931, 285

(56) References Cited

U.S. PATENT DOCUMENTS

| 5,076,860 | A | | 12/1991 | Ohba et al. |
| 5,122,845 | A | | 6/1992 | Manabe et al. |
| 6,069,021 | A | | 5/2000 | Terashima et al. |
| 6,270,587 | B1 | * | 8/2001 | Motoki et al. ............. 148/33.4 |
| 6,328,796 | B1 | * | 12/2001 | Kub et al. .................... 117/94 |

FOREIGN PATENT DOCUMENTS

| EP | 0 377 940 A2 | 7/1990 |
| JP | 10-259090 A | 9/1998 |
| JP | 2000-275682 A | 10/2000 |
| JP | 2000-349335 A | 12/2000 |
| JP | 2000-351692 A | 12/2000 |

* cited by examiner

Primary Examiner—Michael Trinh
(74) Attorney, Agent, or Firm—Foley & Lardner LLP

(57) ABSTRACT

A method of epitaxially growing a SiC film on a Si substrate, including: (a) supplying a raw material gas containing a gas having P (phosphorus) element and a gas having B (boron) element on a Si substrate, and thereby synthesizing an amorphous BP thin film having a thickness of 5 nm or more and 100 nm or less on the Si substrate; (b) further supplying a raw material gas containing a gas having P element and a gas having B element on the Si substrate, and thereby synthesizing a cubic boron phosphide single crystal film having a thickness of 5 nm or more and 1000 nm or less on the Si substrate; and (c) supplying a gas having carbon element and a gas having silicon element on the Si substrate thereon the BP single crystal film is formed, and thereby synthesizing a beta-SiC single crystal film or an amorphous SiC film having a thickness of 1 nm or more and several hundreds nanometers or less on the cubic boron phosphide single crystal film on the Si substrate.

24 Claims, 12 Drawing Sheets

(a)

(b)

EMBODIMENT 8

COMPARATIVE EMBODIMENT 1

COMPARATIVE EMBODIMENT 2

(A)

(B)

(B)

SEMICONDUCTOR WAFER AND ITS MANUFACTURING METHOD

BACKGROUND OF THE INVENTION

1. Field of the Invention

The present invention relates to a semiconductor fabricated according to an epitaxial growth method and to a method for fabricating the semiconductor.

2. Description of the Related Art

A method of fabricating a c-BP semiconductor has been known. An existing c-BP semiconductor is fabricated by epitaxially growing a c-BP film on a Si substrate.

Furthermore, a method of fabricating a 3C-SiC is also known. The 3C-SiC semiconductor can be fabricated by carbonizing a surface of a Si substrate with a hydrocarbon gas followed by allowing epitaxially growing 3C-SiC with silane or a propane gas. When a SiC film is epitaxially grown on the surface of the Si substrate, there is a lattice mismatch between Si to be a substrate and SiC to be grown thereon. Accordingly, a large number of crystal defects due to misfit dislocations are caused, resulting in causing a problem when a device is fabricated. Therefore, as mentioned above, the surface of the Si substrate is carbonized with a hydrocarbon gas, and with this a SiC layer is grown as a buffer layer SiC.

According to this existing method, however, since Si atoms inside of the Si substrate are taken away to a surface of the substrate because of the carbonization, vacancies are generated in the Si substrate, resulting in roughening the Si substrate.

On the other hand, a method of fabricating a GaN semiconductor for use in short wavelength LEDs is also known. A GaN semiconductor is fabricated by epitaxially growing a GaN single crystal film on a surface of a sapphire or Si substrate. Also in the case of the GaN film is epitaxially grown, there is a lattice mismatch between sapphire or Si to be a substrate and GaN to be grown thereon. Accordingly, a large number of crystal defects are caused because of the misfit dislocations and the difference of thermal expansion coefficients, resulting in causing a problem when a device is fabricated.

SUMMARY OF THE INVENTION

Accordingly, one object of the present invention is to provide a semiconductor that can overcome the lattice mismatch between a material of a substrate and a material that is epitaxially grown, and a method of fabricating the same.

The other object of the present invention is to provide a SiC or GaN semiconductor that can suppress the misfit dislocations due to the difference of lattice constants, has excellent performance as semiconductor functions, and is high in quality, and a method of fabricating these by use of an epitaxial growth method.

First, a SiC semiconductor will be described.

The SiC semiconductor, in particular a 3C-SiC semiconductor, is fabricated by epitaxially growing 3C-SiC mainly on a Si (silicon) substrate.

In such an epitaxial growth, a deposition layer inherits crystallinity and flatness of the Si substrate. Accordingly, in view of obtaining high quality crystals, the treatment that roughens the substrate, which may occur in the existing technology, should be avoided.

Accordingly, in order not to roughen the substrate, it is preferable to dispose a buffer layer of an appropriate material.

For instance, when 3C-SiC is epitaxially grown on the Si wafer to be the substrate, c-BP that is a zinc blende type single crystal BP (boron phosphide) is used as a buffer layer. Thereby, crystal defects are reduced.

A lattice constant of Si is 5.43 angstrom and that of 3C-SiC is 4.358 angstrom. That is, there is a lattice mismatch such large as 20% between these. However, a lattice constant of BP (boron phosphide) that is a zinc blende type crystal is 4.538 angstrom, being substantially the same with 4.358 angstrom of 3C-SiC. Accordingly, the BP can suppress the misfit dislocations due to the lattice mismatch. Furthermore, thermal expansion coefficients are substantially the same between these.

Although there is a difference of 16.4% between the lattice constant of c-BP and that of substrate Si, c-BP can be heteroepitaxially grown on the Si substrate. Furthermore, c-BP, being conductive, is advantageous when devices are prepared. When the c-BP is epitaxially grown on the Si substrate, cubic silicon carbide (3C-SiC) crystal close in the lattice constant to that of c-BP can be heteroepitaxially grown with the misfit dislocations suppressed. In power devices, when 3C-SiC or so called β-SiC is grown on the Si substrate, when processing and fabricating lines of Si devices can be diverted, it industrial merit is very large.

Since c-BP contains P, a vapor pressure thereof is high. As a result, it decomposes at a temperature lower than the melting point thereof. Accordingly, before a temperature and a atmospheric pressure that are necessary for epitaxially growing 3C-SiC are attained, decomposition starts from a c-BP surface and heteroepitaxial growth tends to be disturbed. The present invention intends to provide a method and a semiconductor that can evade such the disturbances.

Next, a GaN semiconductor will be described.

GaN grown on the sapphire or Si substrate is a Wurtzite crystal and has a difficulty in cleaving. Since a reflection surface is necessary in preparing a laser chip, which is normally formed along a cleavage surface, it can be prepared with difficulty. On the other hand, a GaN single crystal according to the present invention has, physically as a metastable state, a zinc blende structure similar to Si. Accordingly, when a superlattice structure is formed with crystal defects due to the difference of the lattice constants suppressing with the Si substrate, a c-GaN single crystal film having a cleavage surface can be grown. As a method of attaining the super lattice structure, an intermediate layer (buffer layer) for alleviating the lattice mismatch is formed.

As mentioned above, the largest point in the present invention is to form a 3C-SiC film or a c-GaN film on the Si substrate (Si wafer) with a buffer layer made of c-BP (cubic boron phosphide) interposed therebetween.

A thickness of the buffer layer (c-BP layer) is preferably in the range of 1 nm to 5 µm. A thickness of the SiC film is 10 µm or more, preferably 20 µm or more.

As raw material gas of c-BP layers, phosphine and diborane are particularly preferable. As a raw material gas of the SiC film, monomethylsilane is preferable when the SiC film is grown at a low temperature, and a CVD method is used to grow. In a high temperature growth, though monomethylsilane can be used similarly to the case of low temperature growth, acetylene and silane, or propane and silane, which allow growing at a high growth rate under a high temperature are preferably used, and the CVD method is used to grow.

It is preferable to form amorphous SiC on the c-BP layer at a low temperature. The reason for this is to inhibit BP from decomposing. In an atmosphere where a partial pressure of phosphorus is zero, at temperatures of 900 degree centigrade or more, c-BP gradually decomposes and becomes $B_{13}P_2$ at 1130 degree centigrade or more. Once the amorphous SiC is formed, the temperature may exceed 1200 degree centigrade.

At first, a very thin amorphous SiC layer is formed, thereafter at a high temperature 3C-SiC crystal is formed. By performing this, a high quality crystal can be obtained. The amorphous layer, in some cases, disappears during the high temperature crystal growth. Furthermore, without the amorphous layer, the SiC crystal film can be formed.

When the 3C-SiC film is grown on the Si substrate, as a buffer intermediate layer (buffer layer) an intermediate layer of c-BP that is a cubic crystal the same as Si is formed. However, according to the present invention, even when c-BP is a material containing phosphorus atoms (P), it can be evaded for the c-BP to decompose at a temperature lower than a melting point thereof and to disturb a crystal layer to be formed thereon from growing. This point will be explained.

After the c-BP layer is grown on the Si substrate, with organometallic silane raw material and at a low temperature in the range of 300 to 800 degree centigrade, an amorphous film that becomes a foundation layer of a 3C-SiC single crystal film is grown to a thickness of several hundreds nm or less followed by carrying out crystal growth of the 3C-SiC film at a temperature in the range of 800 to 1200 degree centigrade. The SiC film formed at a low temperature functions as a cap layer that suppresses the c-BP layer from decomposing, and with a cubic structure the same as the Si substrate maintaining, the deposition of 3C-SiC on the Si substrate is attained. At this time, it is considered that the low temperature growth layer functions as a film for shielding the c-BP film from atmosphere gas. When the 3C-SiC film is formed further thicker, a carrier density becomes such low as $1.0 \times 10^{15}$ to $1.0 \times 10^{16}$, as a result, it can be utilized as a SiC semiconductor only by controlling the carrier.

In one preferred mode for implementing the present invention, a cubic silicon carbide (3C-SiC) film is epitaxially grown on a silicon substrate with a buffer layer interposed therebetween, and thereby when a 3C-SiC semiconductor is fabricated, an amorphous SiC film can be firstly formed on a c-BP layer. For instance, after the c-BP film is epitaxially grown on the Si substrate, on the c-BP layer the amorphous SiC film is deposited. At that time, in particular, a deposition temperature of the amorphous SiC is preferable to be in the range of 300 to 600 degree centigrade.

According to one preferable mode for implementing the invention, in order to improve the crystallinity as a device, at a temperature equal to or less than a thermal decomposition starting temperature of BP, an amorphous layer of SiC is formed on a buffer layer. Thereby, the amorphous layer of the SiC functions as a shield film to an atmosphere gas, and thereby BP is hindered from decomposing.

Another preferable mode for implementing the invention will be explained. Since c-BP is a material containing P, it decomposes at a temperature lower than a melting point thereof. This disturbs a later heteroepitaxial growth. There, after a c-BP layer is epitaxially grown, at a relatively low temperature in the range of 300 to 600 degree centigrade, an amorphous layer of SiC is grown to a thickness of several hundreds nm or less, subsequently a substrate temperature is elevated to a temperature equal to or less than a c-BP growth temperature, for instance a temperature equal to or less than 700 degree centigrade, and annealing is performed. Thereafter, at a predetermined temperature, 3C-SiC is crystal grown. At this time, an annealing temperature is effective to be as close as possible to the crystal growth temperature of SiC.

When the amorphous SiC layer is disposed at a relatively low temperature, the c-BP layer is suppressed from decomposing and can be heated to a temperature that can exhibit an annealing effect. When the temperature is elevated without forming at a low temperature a film for shielding the c-BP layer against the atmosphere gas, although the crystallinity of the c-BP layer can be improved, because of the decomposition of BP, P composition ratio deteriorates, resulting in causing difficulty in subsequent deposition of SiC.

When SiC is grown at a low temperature followed by annealing, while suppressing BP from decomposing, the buffer layer of the c-BP layer is improved in the crystallinity, and by this improvement of the buffer layer, a high quality heteroepitaxial SiC crystal can be obtained.

When a SiC single crystal film is epitaxially grown on Si that is a substrate, the aforementioned buffer layer can be effectively used. Although the lattice constant of c-BP that is a zinc blende type crystal is different by 16.4% from that of Si, c-BP can be heteroepitaxially grown on the Si.

When a material having a high vapor pressure like cubic boron phosphide (c-BP) is epitaxially grown, an evacuated state is prepared. That is, when the c-BP layer is epitaxially grown on Si that is a substrate, it can be grown even in a depressurized furnace. For this, in a depressurized atmosphere, an appropriate partial pressure of phosphorus (P) raw material is maintained. For instance, a partial pressure of phosphine ($PH_3$) is controlled to be $10^0$ Torr or more. By the control, a high quality c-BP layer can be obtained.

When c-BP is epitaxially grown on a Si substrate, a cubic silicon carbide (3C-SiC) crystal close in the lattice constant to c-BP can be heteroepitaxially grown with the misfit dislocations suppressed.

A raw material gas containing a gas having phosphorus element and a gas having boron element is supplied onto a Si substrate. Thereby, a boron phosphide amorphous thin film having a thickness of 5 nm or more and 100 nm or less is synthesized on the Si substrate. The raw material gas used here contains each of a gas having phosphorus element and a gas having boron element in the range of 0.01 to 30.00% by volume in a total gas. Furthermore, a deposition temperature at this time is in the range of 300 to 700 degree centigrade (preferably in the range of 300 to 650 degree centigrade).

Onto the Si substrate, a raw material gas containing a gas having phosphorus element and a gas having boron element is further supplied. Thereby, a cubic boron phosphide single crystal thin film having a thickness of 5 nm or more and 5,000 nm or less is synthesized on the Si substrate. The raw material gas used here may contain each of the gas having phosphorus element and the gas having boron element in the range of 0.01 to 30.00% by volume in a total gas. Furthermore, the deposition temperature at this time is in the range of 700 to 1100 degree centigrade.

Onto the Si substrate thereon the cubic boron phosphide single crystal thin film (c-BP layer) is synthesized, a gas having carbon element and a gas having silicon element are supplied. Thereby, a β-SiC single crystal thin film or an amorphous SiC thin film having a thickness of 1 nm or more and 100 nm or less is synthesized on the cubic boron phosphide single crystal thin film on the Si substrate. The raw material gas used here contains each of the gas having carbon element and the gas having silicon element in the range of 0.01 to 30.00% by volume in a total gas. Furthermore, the deposition temperature at this time is in the range of 300 to 800 degree centigrade.

The Si substrate is annealed at a temperature in the range of 800 to 1200 degree centigrade, and thereby the previously formed cubic boron phosphide single crystal film is improved in its crystallinity.

On the Si substrate, the gas having carbon element and silicon element is again applied, and thereby a beta-SiC single crystal thin film of 1 nm or more and 100 nm or less is synthesized. The raw material gas used here contains each of the gas having carbon element and the gas having silicon element in the range of 0.01 to 30.00% by volume in a total gas. Furthermore, the deposition temperature at this time is in the range of 700 to 1200 degree centigrade.

A series of the above processes is repeated at least two times or more, thereby the cubic boron phosphide single crystal thin film and the beta-SiC single crystal thin film are alternately deposited, resulting in depositing a multi-layered film having a thickness of 1 nm or more and 10 $\mu$m or less on the Si substrate.

Furthermore, the raw material gas containing the gas having carbon element and the gas having silicon element is applied on the Si substrate. Thereby, a beta-SiC single crystal film of 1 $\mu$m or more is synthesized on the Si substrate. The raw material gas used here contains each of the gas having carbon element and the gas having silicon element in the range of 0.01 to 30.00% by volume in a total gas. Furthermore, the deposition temperature at this time is in the range of 800 to 1200 degree centigrade.

Still furthermore, as another mode of implementing the invention, after 3C-SiC is formed on a Si wafer, a $SiO_2$ film may be formed on a 3C-SiC single crystal surface so that a thickness thereof may be preferably two to four times that of the SiC film. Alternatively, on a rear surface of the Si wafer, a $Si_3N_4$ film may be deposited so that a thickness thereof may be the same as that of the 3C-SiC. By thus implementing, warpage due to the difference of thermal expansions between the Si wafer and 3C-SiC can be alleviated.

BRIEF DESCRIPTION OF THE DRAWINGS

FIG. 6, lower one, is a schematic diagram showing a situation when it is cooled to room temperature.

FIG. 7, lower one, is a schematic diagram showing a situation when it is cooled to room temperature.

DESCRIPTION OF THE PREFERRED EMBODIMENTS

Figure 1:
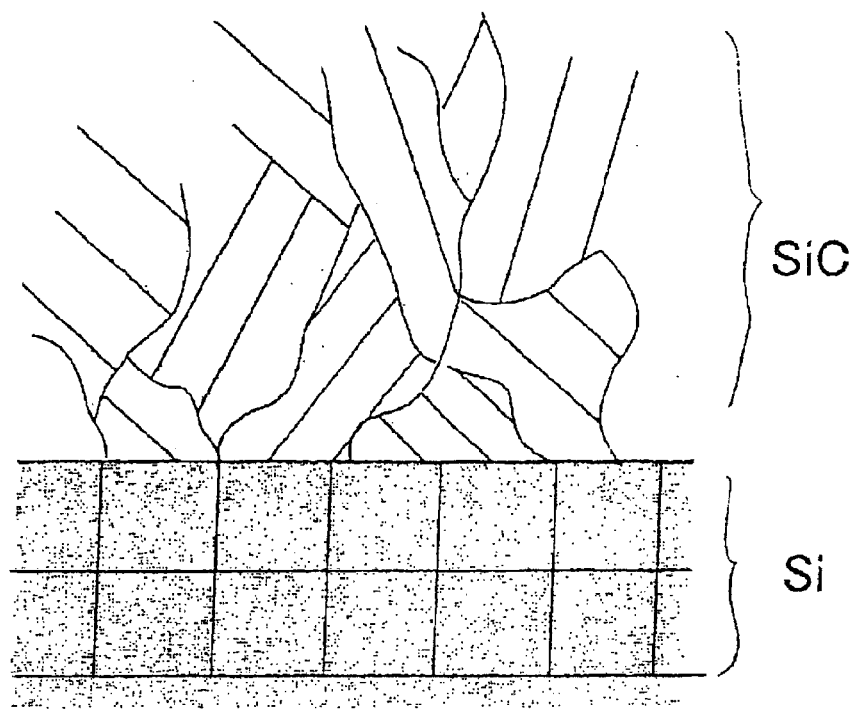
FIG. 1(a) is a schematic diagram showing a situation when SiC is grown directly on a Si wafer.
FIG. 1(b) is a schematic diagram showing growth of a 3C-SiC single crystal according to one preferred embodiment 1 of the present invention.
Figure 1:
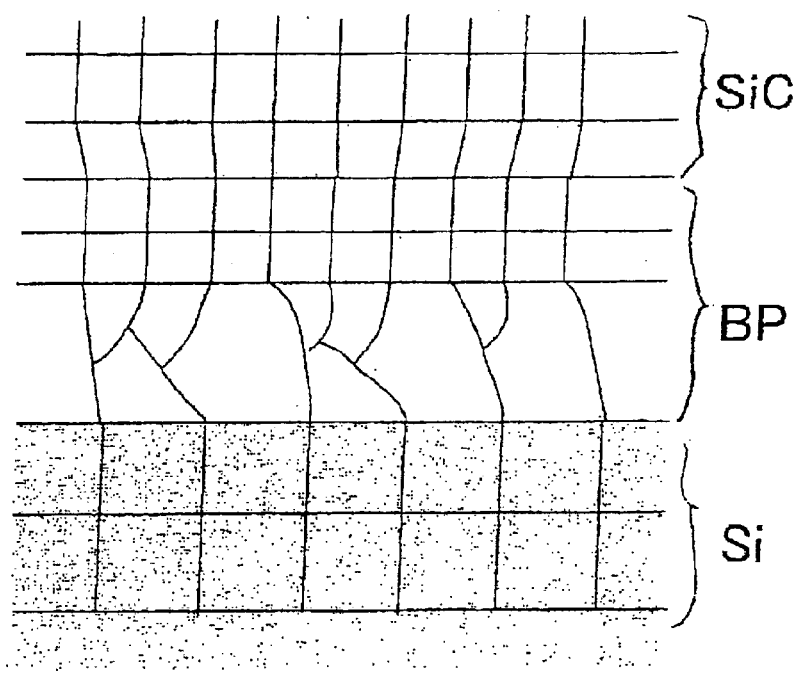

A plurality of preferred embodiments will be explained. The present invention is not restricted to the following embodiments. For instance, as the raw material gas, various kinds such as chlorides, hydrides, and organometallic raw materials can be used. The process time, temperature, pressure and order thereof may be appropriately selected depending on a target semiconductor wafer.

Embodiment 1

According to the following processes (1) through (8), a 3C-SiC semiconductor is fabricated.

(1) A substrate, Si (100) or (111), is heated to 1000 degree centigrade or more in a hydrogen atmosphere, and thereby a native oxide film on the substrate is removed.

(2) Together with hydrogen as a carrier gas, $BCl_3$, B raw material, and $PCl_3$, P raw material are introduced into a reaction tube followed by a low temperature growth process at a temperature in the range of substantially 200 to 700 degree centigrade for substantially 30 min.

(3) At completion of the low temperature growth process, the raw material supply of BP is stopped, and the temperature is elevated to 800 to 1200 degree centigrade that is a crystal growth temperature of BP.

(4) When the growth temperature in the range of 800 to 1200 degree centigrade is attained, BP raw material supply is started and maintained as it is for 30 min or more, and thereby a BP layer is deposited in a thickness of substantially 1 to 5 $\mu$m.

(5) When the crystal growth period has come to completion, the BP raw material supply is stopped, and the temperature is maintained as it is for substantially 30 min.

(6) Subsequently, the temperature is set in the range of 200 to 700 degree centigrade that is a low temperature growth temperature of SiC, and methylsilane that is raw material is started and kept supplying for substantially 10 min.

(7) The temperature is set in the range of substantially 800 to 1200 degree centigrade that is a crystal growth temperature of SiC and held there for 30 min or more, and thereby a SiC layer of 10 to 30 µm is deposited.

(8) When the crystal growth period of 3C-SiC has come to completion, methylsilane raw material supply is stopped, and the temperature is kept on for substantially 30 min.

In order to compare with the 3C-SiC semiconductor (in particular crystal thereof) fabricated according to the above processes (1) through (8), a 3C-SiC semiconductor in which a 3C-SiC crystal is grown on a Si substrate without interposing a BP layer, that is, under the conditions in which the processes (2) through (5) are removed is tried to fabricate. When these are compared, the followings are found. That is, in the 3C-SiC semiconductor crystal fabricated with the BP buffer layer, the misfit dislocations due to the difference of the lattice constants are excellently suppressed and a high quality crystal is obtained, on the other hand, in one that is fabricated without the BP buffer layer, only polycrystalline SiC is formed, that is, single crystal SiC cannot be fabricated.

Embodiment 2

Figure 2:
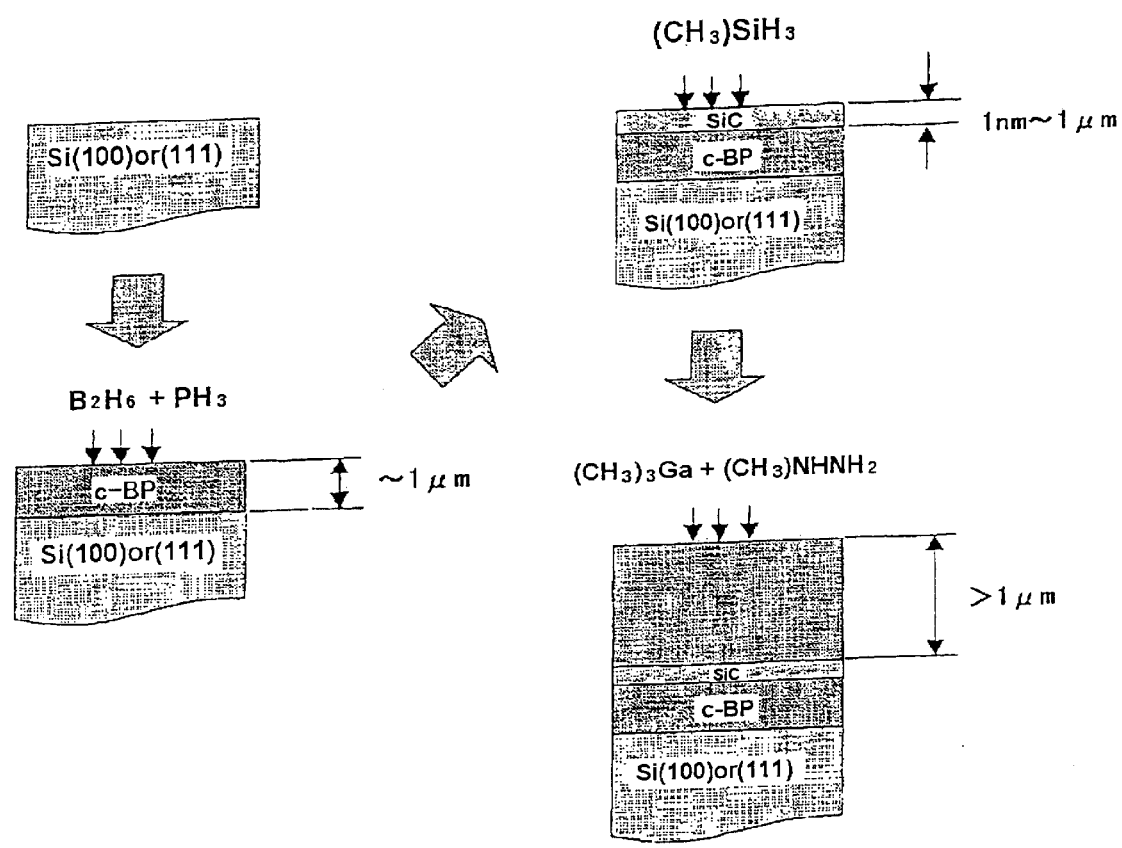
FIG. 2 is an explanatory diagram showing an outline of a method of fabricating a semiconductor according to embodiment 2 of the present invention.

First, with reference to FIG. 2, embodiment 2 of the present invention will be explained. Following arrow marks, fabrication processes proceed.

(1) First, a Si substrate (100) or (111) is heated to 1000 degree centigrade or more in a hydrogen atmosphere, and thereby a native oxide film on a substrate surface is removed.

(2) Subsequently, $B_2H_6$ and $PH_3$ are supplied, the substrate is heated to a temperature in the range of 800 to 1000 degree centigrade, and a c-BP crystal growth process is carried out until a film thickness of substantially 0.07 to 1 µm is attained.

(3) Thereafter, with $PH_3$ keeping supplying, the temperature is lowered to a temperature in the range of 200 to 500 degree centigrade, $PH_3$ supply is stopped, monomethylsilane ($CH_3SiH_3$) is supplied, and thereby a low temperature layer of SiC is deposited to a thickness in the range of substantially several nanometers to 100 nm.

(4) Subsequently, the substrate temperature is elevated to 500 to 900 degree centigrade, and simultaneously with annealing the low temperature layer a 3C-SiC single crystal film is deposited to a thickness of substantially several nanometers to 1 µm.

(5) Thereafter, monomethylsilane supply is stopped, the substrate temperature is maintained at a temperature in the range of 800 to 1100 degree centigrade, trimethyl gallium (($CH_3)_3Ga$) and methyl hydrazine ($CH_3NHNH_2$) are supplied, and thereby c-GaN is deposited to a thickness of 1 µm or more.

When a semiconductor is thus fabricated through the processes (1) through (5), a growth layer of 3C-SiC is formed after c-BP is grown on the Si substrate. Accordingly, the c-BP single crystal film can be suppressed from decomposing and a c-GaN superlattice deposition film can be obtained.

For comparison purpose, a c-GaN crystal is grown without growing the 3C-SiC layer, that is, under the conditions where the above operations (3) through (5) are removed. In one in which c-BP film capping due to the SiC film is not implemented, a c-GaN single crystal cannot be deposited in a large area, and because of phosphorus and boron impurities a higher grade c-GaN crystal film cannot be obtained.

The SiC layer for capping c-BP can provide a desired effect even when it has such a thin amorphous film thickness as substantially 100 nm or less.

The deposition of c-GaN can be performed with, other than organometallic raw material, $NH_3$ as a nitrogen source.

Embodiment 3

Figure 3:
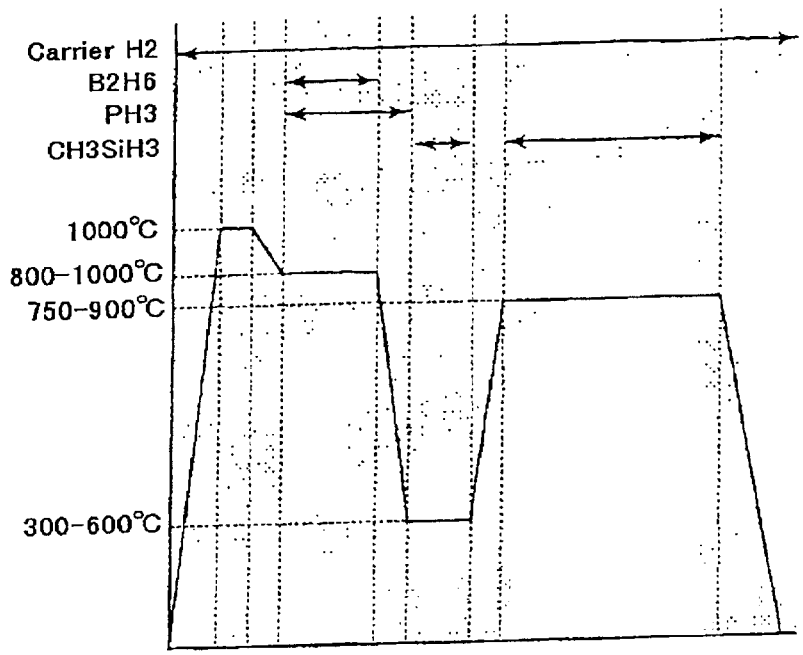
FIG. 3 is an explanatory diagram showing an outline of a method of fabricating a semiconductor according to embodiment 3 of the present invention.
Figure 4:
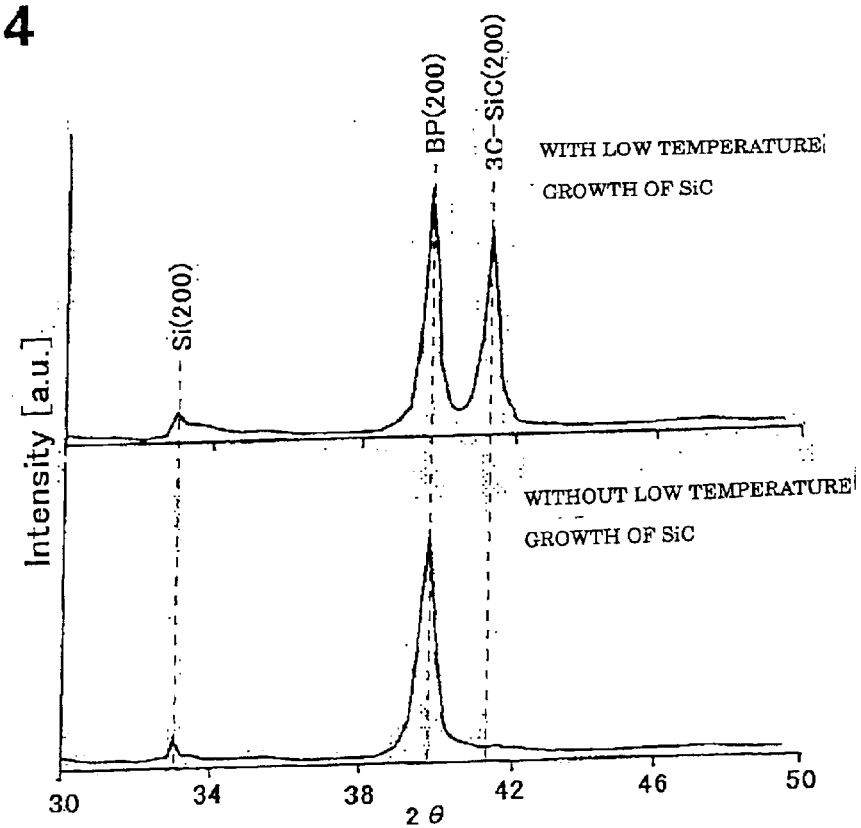
FIG. 4 is a graph showing an effect of a SiC low temperature growth layer due to X-ray diffraction of a semiconductor fabricated according to the fabricating method shown in FIG. 3.

With reference to FIGS. 3 and 4, embodiment 3 of the present invention will be explained.

At predetermined temperatures shown in FIG. 3, a 3C-SiC film is heteroepitaxially grown.

(1) First, a substrate (Si) is heated to 1000 degree centigrade or more in a hydrogen atmosphere, and thereby a native oxide film on a substrate surface is removed.

(2) Thereafter, the temperature is elevated to 800 to 1000 degree centigrade followed by supplying $B_2H_6$ and $PH_3$, and thereby c-BP is crystal grown and deposited to a thickness of substantially 1 µm.

(3) Furthermore, with $PH_3$ supplying, the temperature is lowered to 300 to 600 degree centigrade followed by stopping supplying $PH_3$ further followed by supplying monomethylsilane ($CH_3SiH_3$), and thereby a low temperature growth layer of SiC is deposited to a thickness of substantially 50 nm or less.

(4) Subsequently, the temperature is elevated to 750 to 900 degree centigrade, monomethylsilane ($CH_3SiH_3$) is supplied, and thereby a crystal growth layer of 3C-SiC is deposited to a thickness of 5 µm or more.

In order to compare with one that is fabricated through the above processes (1) through (4), one in which after c-BP crystal is grown a SiC low temperature growth layer is not disposed is prepared, and its crystallinity is compared with the above one.

FIG. 4 shows results evaluated by X-ray diffraction of crystals fabricated with Si (100) as a substrate as mentioned above.

As obvious also from FIG. 4, when a low temperature growth layer of SiC is disposed after c-BP is grown on the Si substrate, the c-BP can be hindered from degenerating, resulting in obtaining a high quality heteroepitaxial crystal. On the other hand, in one in which the low temperature growth layer of SiC is not disposed (comparative embodiment), the heteroepitaxial crystal of 3C-SiC cannot be confirmed.

Embodiment 4

Figure 5:
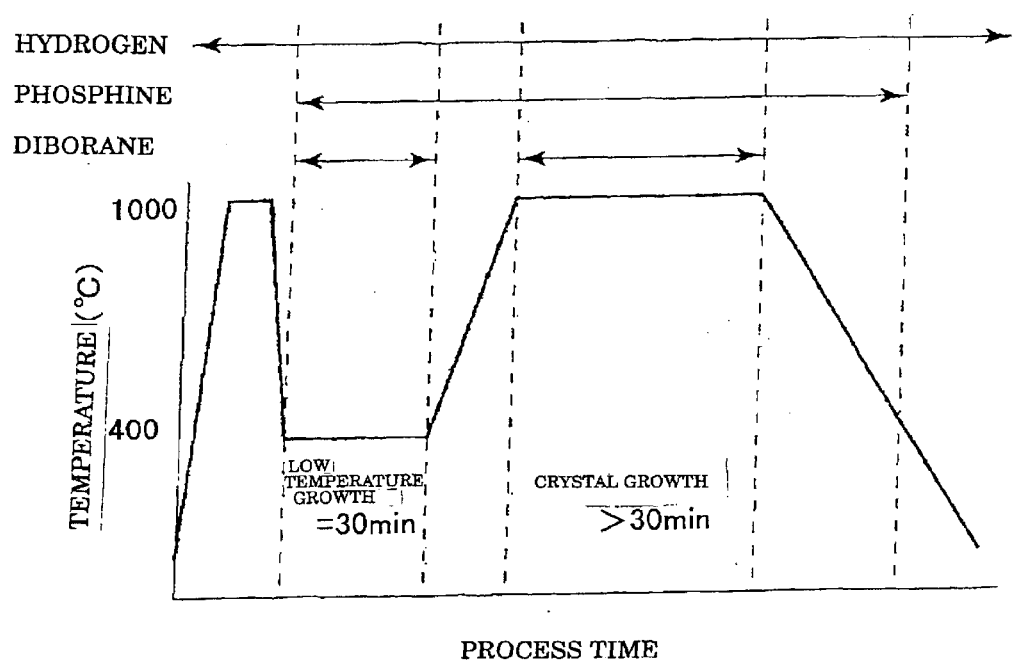
FIG. 5 is an explanatory diagram showing an outline of a method of fabricating a semiconductor according to embodiment 4 of the present invention.

With reference to FIG. 5, Embodiment 4 of the present invention will be explained.

A flow rate of a P raw material gas into a furnace is determined so that a partial pressure of the P raw material gas may be $10^0$ to $10^1$ Torr. By implementing thus, even in a reduced pressure atmosphere, high quality c-BP whose ratio of B to P is 1:1 can be obtained.

An example of procedure thereof is as follows.

(1) A pressure in a furnace is lowered to 50 Torr in a current of hydrogen of 30 L/min.

(2) A substrate, Si (100) or (111), is heated to 1000 degree centigrade or more in a hydrogen atmosphere, and thereby a native oxide film on a substrate surface is removed.

(3) The temperature is set at a temperature in the range of 800 to 1000 degree centigrade that is a growth temperature.

(4) Phosphine ($PH_3$) is flowed at a rate of 3 L/min in terms of phosphine 100% so that a partial pressure of phosphine may be $10^0$ to $10^1$ Torr, and diborane ($B_2H_6$) is flowed at a rate of 1 cc/min in terms of diborane 100%, and thereby a low temperature growth layer of c-BP is grown to a thickness of 100 nm or less.

(5) The $B_2H_6$ supply is stopped, and with $PH_3$ flowing, the temperature is lowered.

Thus, when a flow rate of a P raw material gas into a furnace is determined so that the partial pressure of the P raw material gas may be $10^0$ to $10^1$ Torr, even in a reduced pressure atmosphere high quality c-BP whose ratio of B to P is 1:1 can be obtained. Subsequently, when 3C-SiC is grown, a high quality 3C-SiC crystal in which the misfit dislocations are suppressed from occurring can be obtained.

Embodiments 5 and 6

Figure 6:
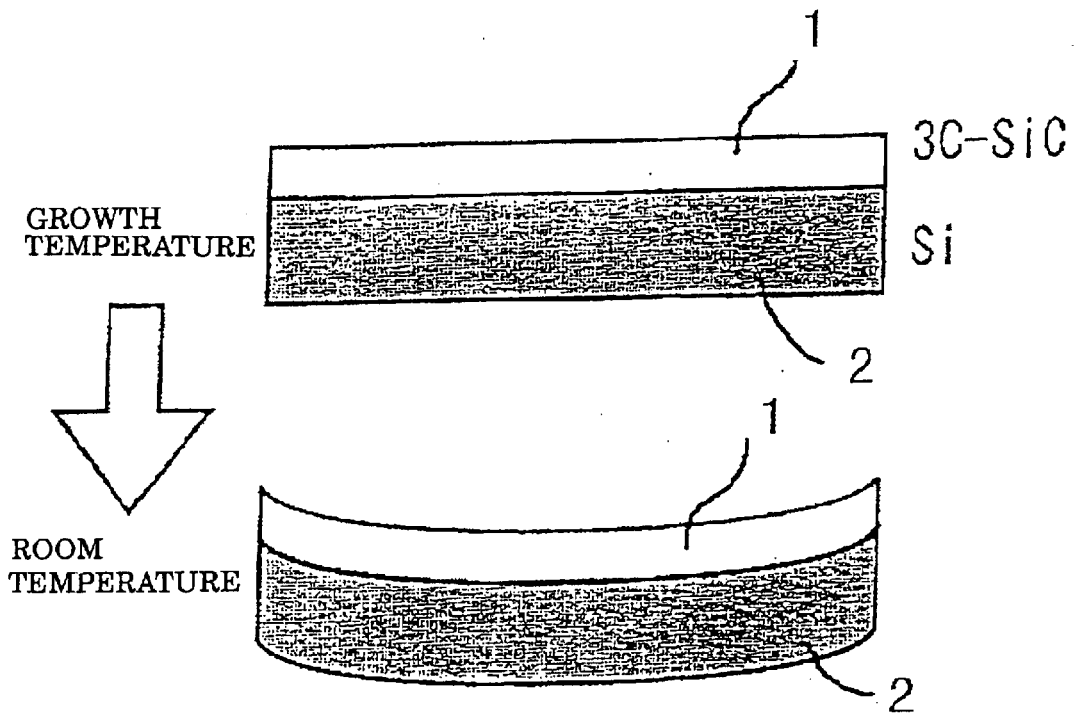
FIG. 6, upper one, is a schematic diagram showing a situation when SiC is epitaxially grown at a growth temperature on a Si substrate.

As shown in FIG. 6, when on a surface of a Si substrate 2 a 3C-SiC film 1 is epitaxially grown at a growth temperature (800 to 1200 degree centigrade) to a predetermined thickness followed by cooling to room temperature, there occurs warpage because of the difference of thermal expansion coefficients of Si and SiC. There is substantially 8% difference in thermal expansion coefficient between Si to be a substrate and SiC to be grown. Accordingly, after the growth, compression stress is applied on an epitaxial film, and the 3C-SiC film 1 and the Si substrate 2 warp. It is expected that the warpage may cause problems when a device is prepared. Furthermore, peeling or fracture of the film 1 may be caused. Accordingly, it is important to suppress an amount of the warpage.

Figure 7:
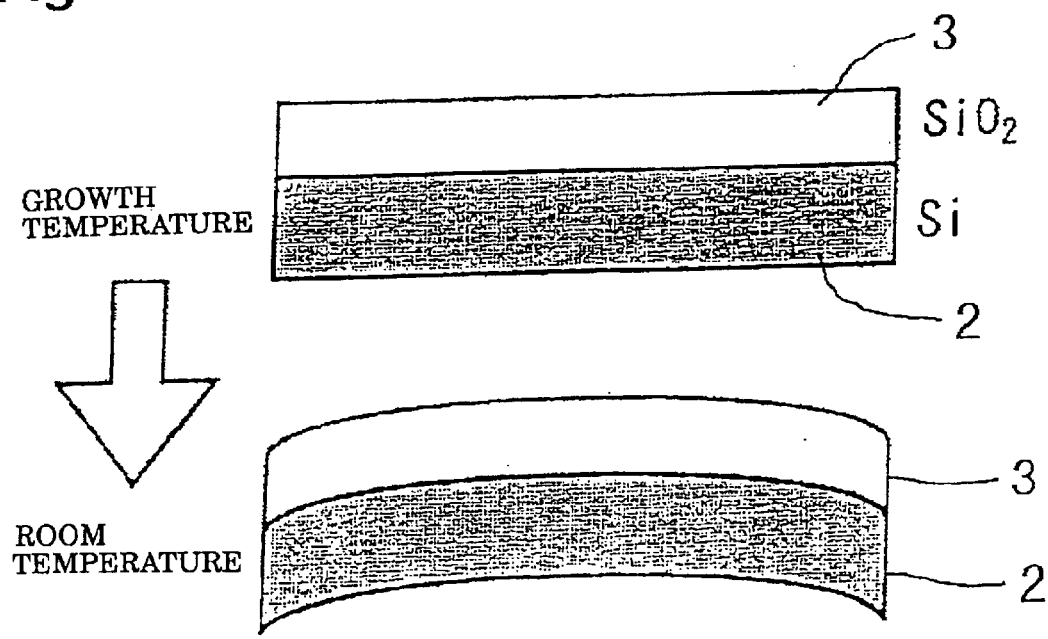
FIG. 7, upper one, is a schematic diagram showing a situation when $SiO_2$ is grown at a growth temperature on a Si substrate.

As shown in FIG. 7, when a $SiO_2$ film 3 is grown up to a predetermined thickness on a surface of a Si substrate 2 at a growth temperature (600 to 900 degree centigrade) followed by cooling to room temperature, the warpage due to the difference of thermal expansion coefficients of Si and $SiO_2$ is caused in a direction opposite to FIG. 6.

Embodiment 5 intends to effectively utilize the warpage of FIGS. 6 and 7 to cancel out each other, and thereby hindering the warpage of 3C-SiC film 1 from occurring. That is, on a surface of a Si substrate 5, a 3C-SiC film 6 is epitaxially grown followed by, without largely lowering the temperature, growing a $SiO_2$ film 7, thereby an amount of warpage is controlled, resulting in a 3C-SiC/Si substrate.

Figure 8:
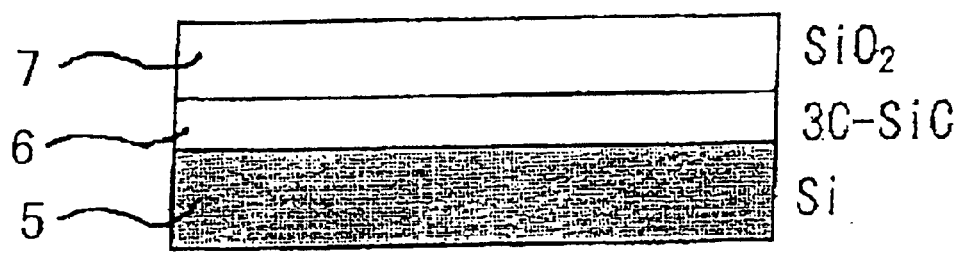
FIG. 8 is a schematic diagram showing embodiment 5 of the present invention.

For instance, as shown in FIG. 8, on a surface of a Si substrate 5 a 3C-SiC film 6 is epitaxially grown up to a predetermined thickness (5 to 10 µm) at a predetermined growth temperature (800 to 1200 degree centigrade). Thereafter, without largely lowering the temperature, a $SiO_2$ film 7 smaller in the thermal expansion coefficient than Si and SiC is grown on a surface of the 3C-SiC film 6. Thereby, when the semiconductor wafer is cooled to room temperature, the warpage of FIG. 6 cancels out the warpage of FIG. 7, resulting in reduction in a resultant warpage.

A thermal expansion coefficient of the amorphous $SiO_2$ film 7 is substantially only one fifth that of Si or SiC, a very small value. Accordingly, preferably, a film thickness of the $SiO_2$ film 7 is set at two to four times that of the epitaxially grown SiC film 6.

Since $SiO_2$ is electrically an insulator, when a device is fabricated, after local etching of the $SiO_2$ film, an electrode material may be deposited.

Figure 9:
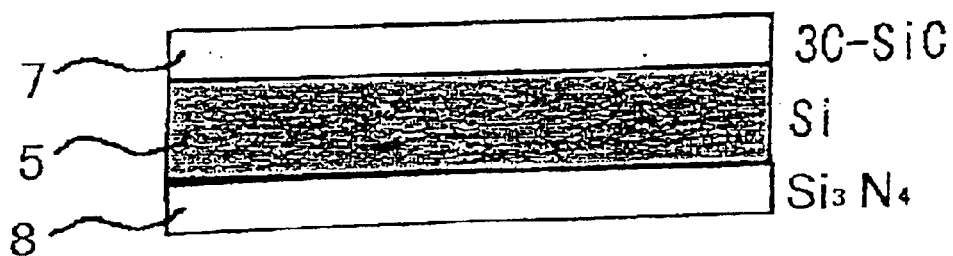
FIG. 9 is a schematic diagram showing embodiment 6 of the present invention.

In order to obtain an effect similar to the above, as shown in FIG. 9, on a rear surface of the Si substrate 5 a $Si_3N_4$ film 8 having a thermal expansion coefficient similar to that of a SiC film 7 may be deposited to a thickness similar to that of the SiC film 7.

In the epitaxial growth process, a growth film inherits the crystallinity of the Si substrate 5. Accordingly, in view of obtaining a crystal of excellent quality, irregularity or roughness of the Si substrate 5 should be avoided. Accordingly, in order not to cause irregularity or roughness of the Si substrate 5, a buffer film due to an appropriate material is preferable to be disposed.

In the following, a preferred example will be explained.

(1) A Si substrate, Si (100) or (111), is heated in a hydrogen atmosphere to a temperature of 1000 degree centigrade or more, and thereby a native oxide film on the Si substrate is removed.

(2) Together with hydrogen as a carrier gas, $BCl_3$, B raw material, and $PCl_3$, P raw material are introduced into a reaction tube followed by a low temperature growth process for 30 min in the range of substantially 200 to 500 degree centigrade.

(3) When the low temperature growth process has come to completion, BP raw material supply is stopped, and the temperature is elevated to 900 to 1200 degree centigrade that is a crystal growth temperature of BP.

(4) When the growth temperature in the range of 900 to 1200 degree centigrade is attained, BP raw material supply is started and maintained as it is for 30 min or more, and thereby a BP film is deposited in a thickness of substantially 1 to 5 µm.

(5) After a predetermined crystal growth process has come to completion, the BP raw material supply is stopped, and the temperature is maintained there for substantially 30 min.

(6) Subsequently, the temperature is lowered to 200 to 500 degree centigrade that is a low temperature growth temperature of SiC, and methylsilane that is raw material is started and kept on supplying for substantially 10 min.

(7) The temperature is again elevated to substantially 800 to 1200 degree centigrade that is a crystal growth temperature of 3C-SiC and held there for 30 min or more, and thereby a SiC film of 10 to 30 µm is deposited.

(8) When the predetermined crystal growth process of 3C-SiC has come to completion, methylsilane supply is stopped.

(9) Thereafter, the temperature is set in the range of 600 to 900 degree centigrade, Si alkoxide such as $Si(OC_2H_5)_4$ that is called TEOS is supplied as the raw material gas and kept on supplying for substantially 20 min, and thereby a $SiO_2$ film is grown to substantially two to four times that of the SiC film.

In order to compare with the 3C-SiC semiconductor wafer fabricated according to the above processes (1) through (9), a 3C-SiC/Si substrate is prepared under the conditions in which the $SiO_2$ film is not grown, that is, the operation (9) is removed. When these are compared, in the 3C-SiC semiconductor crystal chip fabricated with the $SiO_2$ film and the BP buffer film, there is no warpage found, and the misfit dislocations due to the difference of the lattice constants are excellently suppressed, resulting in a high quality crystal. On the other hand, in one that is fabricated without the $SiO_2$ film, the warpage is found.

Embodiment 7

Figure 10:
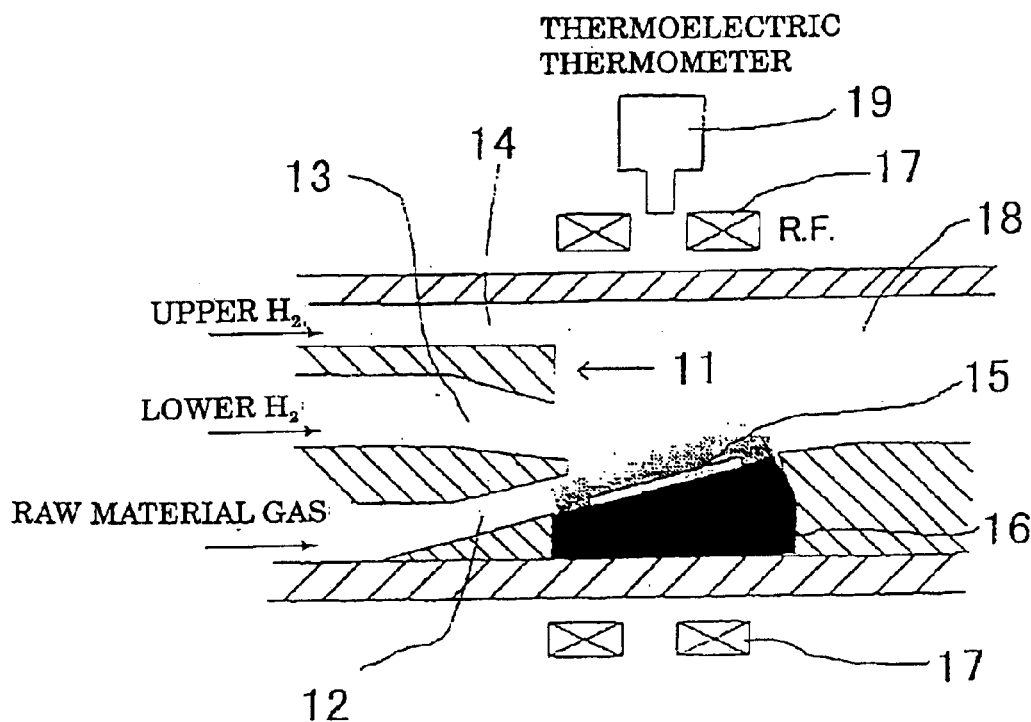
FIG. 10 is a schematic vertical sectional view along a centerline showing one example of epitaxial growth apparatus of a semiconductor according to the present invention.
Figure 11:
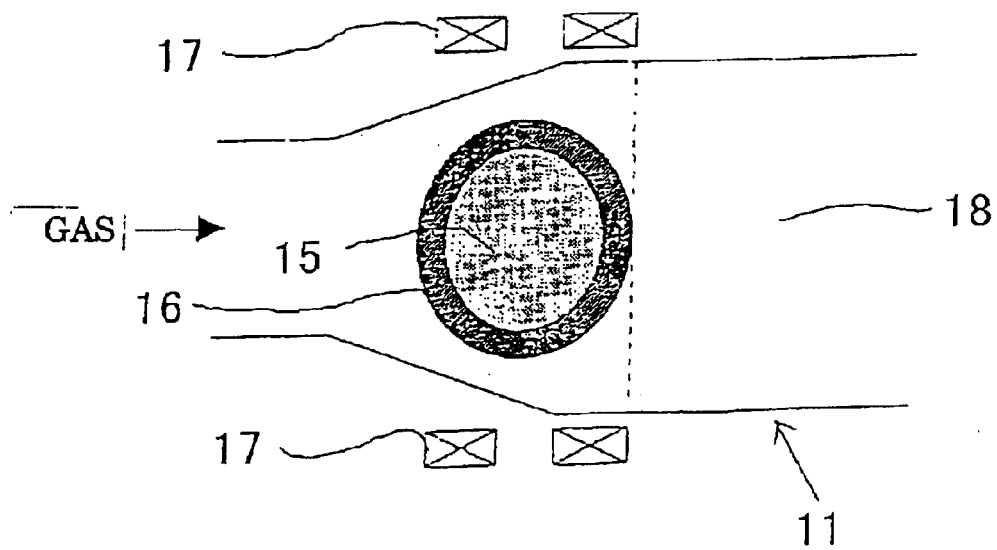
FIG. 11 is a schematic horizontal sectional view along a centerline showing the epitaxial growth apparatus of a semiconductor shown in FIG. 10.

With reference to FIGS. 10 and 11, Embodiments 7 of the present invention will be explained.

A gas supply nozzle 11 for supplying gases into a reaction furnace includes, in turn from bottom up, a raw material gas nozzle 12 positioned at the lowermost, a carrier gas nozzle 13 adjacent thereto at a little bit higher position than the above, and furthermore a furnace contamination-preventive gas nozzle 14 that hinders a furnace interior from being contaminated positioned a little bit higher than the carrier gas nozzle 13. The raw material gas nozzle 12, the carrier gas nozzle 13 and the furnace contamination-preventive gas nozzle 14 are structured in three-stages, and supply, in turn from one close to a substrate 15 up, the raw material gas, the carrier gas and the furnace contamination prevention gas, respectively.

The raw material gas nozzle 12 is formed so that a passage thereof in the neighborhood of an outlet may be inclined toward upper right in FIG. 10 and may have an angle of inclination substantially the same as that of the substrate 15 on a susceptor 16. Accordingly, the raw material gas ejected from the raw material gas nozzle 12 flows upper right along a surface of the substrate 15.

A passage in the neighborhood of an outlet of the carrier gas nozzle 13 is inclined 15 to 45 degree toward lower right in FIG. 10. Accordingly, the carrier gas ejected from the carrier gas nozzle 13 flows along the surface of the substrate 15 on the susceptor 16 and, at this time, presses the raw material gas ejected from the raw material gas nozzle 12 against the surface of the substrate 15.

The furnace contamination-preventive gas nozzle 14 is set so that the contamination-preventive gas ejected therefrom may flow horizontally along a ceiling portion of a space 18 in the furnace. Thereby, the raw material gas in the furnace is suppressed from drifting up, and thereby the furnace is as far as possible hindered from being contaminated by the raw material gas.

The space 18 in the furnace, with the ceiling portion substantially horizontally extending and with a bottom portion being inclined toward upper right as shown in FIG. 10, is narrowed toward downstream, and both side portions thereof, as shown in FIG. 11, are widened at the same angles toward a lower reaches of a gas flow. As a whole, the space 18 in the furnace is widened along the passage.

A thermometer 19 measures a temperature of the substrate 15 on the susceptor 16, and a thermoelectric thermometer, for instance, can be used. In the illustrated example, the thermometer 19 is disposed above the furnace space 18. However, it can be disposed at an arbitrary place other than the above (for instance, inside of the susceptor 16 or therebelow).

The susceptor 16 holds the substrate 15, for instance, a 4 to 6 inch (100) or (111) single crystal Si wafer with a predetermined angle (for instance, 15 to 30 degrees) inclined in the furnace.

Heating means 17 heats the substrate 15 on the susceptor 16, and in the illustrated example, is constituted so that an induction-heating coil may surround an outer circumference of the furnace.

In the following, a procedure for fabricating a 3C-SiC semiconductor by use of semiconductor epitaxial growth apparatus shown in FIGS. 10 and 11 will be explained.

(1) A pressure in the furnace space 18 is set at 1 to 10 Torr and maintained uniform during the processing.

(2) First, a hydrogen gas is introduced from all of the nozzles 12, 13 and 14, a temperature of the Si substrate 15 is elevated to 1000 degree centigrade or more, and thereby surface cleaning of the Si substrate 15 is performed.

(3) Subsequently, the temperature of the Si substrate 15 is lowered to 350 to 450 degree centigrade, phosphine and hydrogen-diluted diborane are introduced from the raw material nozzle 12, hydrogen is introduced from other nozzles 13 and 14, and thereby a c-BP low temperature growth layer is disposed on a surface of the Si substrate 15.

(4) The hydrogen-diluted diborane introduced from the raw material nozzle 12 is once stopped supplying, the temperature of the Si substrate 15 is elevated to 800 to 1000 degree centigrade, the hydrogen-diluted diborane is again introduced, a crystal growth process of c-BP is carried out, and thereby a c-BP film is formed.

(5) The hydrogen-diluted diborane introduced from the raw material nozzle 12 is stopped supplying, the temperature of the Si substrate 15 is lowered to 500 to 600 degree centigrade, phosphine is stopped supplying, and the raw material nozzle 12 is purged with hydrogen. Hydrogen-diluted monomethylsilane is introduced from the raw material nozzle 12, and thereby an initial amorphous layer of 3C-SiC is disposed on a surface of the c-BP film.

(6) Monomethylsilane introduced from the raw material nozzle 12 is stopped supplying, the temperature of the Si substrate 15 is elevated to 1150 to 1350 degree centigrade, hydrogen-diluted silane and propane are introduced, and thereby a crystal growth process of 3C-SiC is further applied on the initial crystal layer of the 3C-SiC.

Embodiment 8

(1) A Si substrate is heated to 1000 degree centigrade or more in a hydrogen atmosphere. Thereby, a native oxide film is removed.

(2) A c-BP crystal growth process is carried out. That is, the Si substrate is heated to 800 to 1000 degree centigrade, $B_2H_6$ and $PH_3$ are supplied onto a surface of the Si substrate as the raw material gas, and thereby a c-BP film having a thickness of substantially 0.5 $\mu$m is deposited.

(3) With $PH_3$ continuing supplying, a low temperature growth layer of SiC is disposed on the c-BP film. That is, the temperature is lowered to 300 to 600 degree centigrade, $PH_3$ is stopped supplying, monomethylsilane ($CH_3SiH_3$) is supplied as a SiC raw material gas, and thereby a SiC layer having a thickness of substantially 0.2 $\mu$m is deposited.

(4) The raw material gas is stopped supplying followed by annealing at 800 degree centigrade equal to or less than a c-BP growth temperature.

(5) A crystal growth process of a 3C-SiC crystal is carried out. That is, the temperature is elevated to 750 to 900 degree centigrade, monomethylsilane ($CH_3SiH_3$) is again supplied, and thereby the 3C-SiC is deposited to a thickness of 5 $\mu$m or more.

Comparative Embodiment 1

As comparative embodiment 1, the deposition is carried out without applying an annealing process. That is, except for (4) of Embodiment 8, the 3C-SiC is deposited similarly to Embodiment 8.

Comparative Embodiment 2

As comparative embodiment 2, the deposition is carried out with the annealing process at 1020 degree centigrade equal to or higher than a c-BP growth temperature applied. That is, the annealing temperature in (4) of the embodiment 8 is altered.

Figure 12:
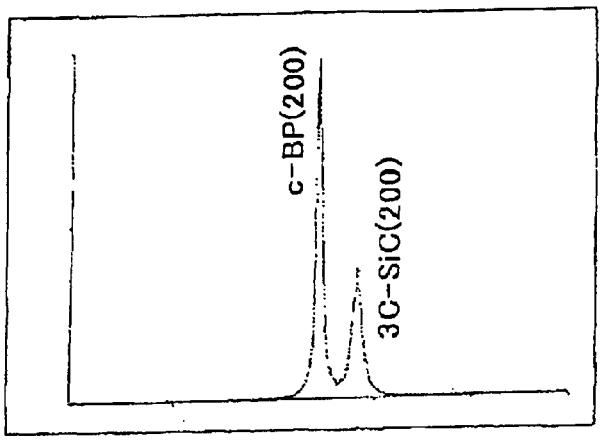
FIG. 12 shows diffraction patterns of X-ray diffraction evaluation results of crystals of the Si substrates due to embodiment 8 and comparative embodiments 1 and 2 of the present invention.
Figure 12:
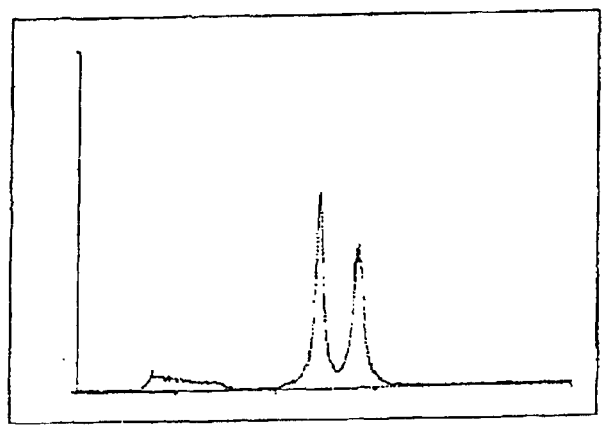
Figure 12:
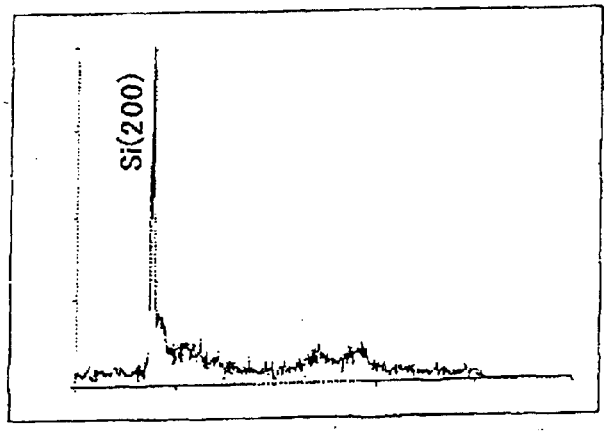
Figure 13:
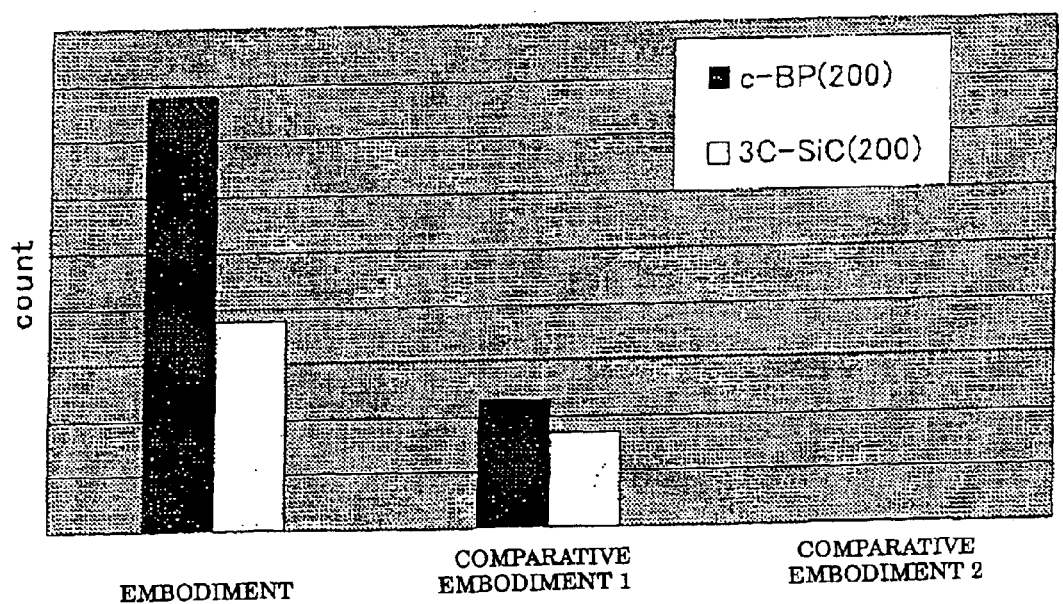
FIG. 13 shows diffraction intensities of X-ray diffraction evaluation results of FIG. 12.

FIG. 12 shows diffraction patterns of X-ray diffraction evaluation results of crystals fabricated in the embodiment 8 and comparative embodiments 1 and 2. FIG. 13 shows the above results as a comparison of diffraction intensities.

As obvious from FIGS. 12 and 13, embodiment 8 where after a c-BP layer is deposited, an amorphous SiC layer is deposited at a low temperature, the c-BP layer is shielded from an ambient atmosphere with the amorphous SiC layer, an annealing process is applied, thereafter a 3C-SiC layer is grown, in comparison with comparative embodiment 1 where the annealing process is not applied, can produce a 3C-SiC heteroepitaxial crystal of higher quality. When the annealing temperature is equal to or more than the c-BP growth temperature as in comparative embodiment 2, the c-BP layer decomposes, resulting in deteriorating the crystallinity of c-BP and 3C-SiC.

When the SiC low temperature growth layer is disposed after the c-BP is grown on the Si substrate, the c-BP can be suppressed from deteriorating. Furthermore, when after the annealing process is applied at a temperature equal to or less than the c-BP deposition temperature to improve the crystallinity of the c-BP layer, the 3C-SiC is crystal grown, a heteroepitaxial crystal of high quality can be obtained.

Embodiment 9

Figure 14:
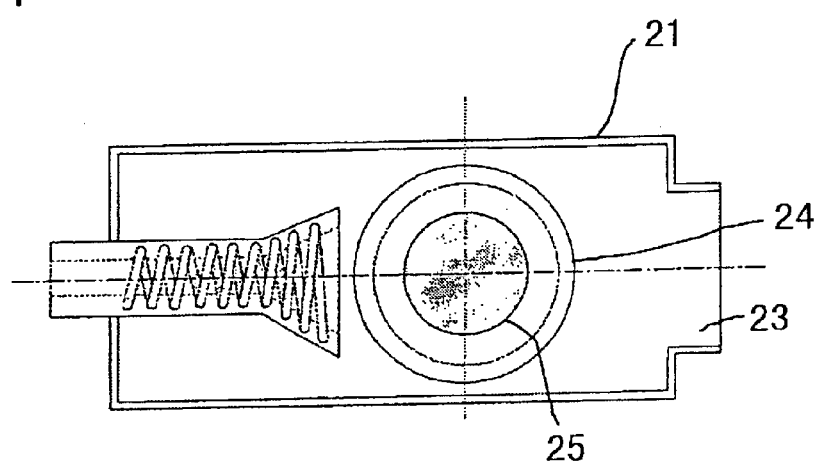
FIG. 14(A) is a schematic plan view showing crystal growth apparatus for implementing the present invention method.
FIG. 14(B) is a schematic longitudinal sectional view showing crystal growth apparatus for implementing the present invention method.
Figure 14:
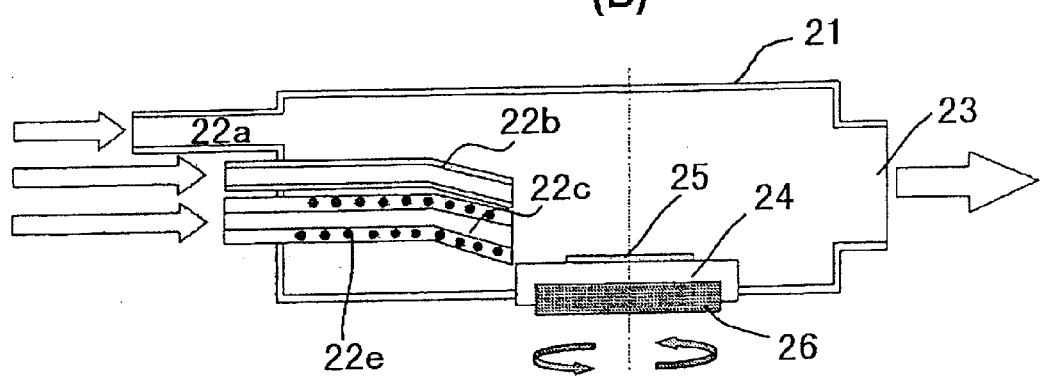
Figure 15:
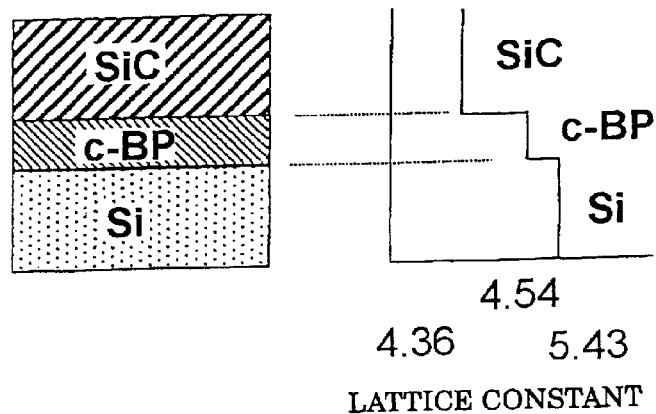
FIGS. 15(A) and 15(B) are sectional views schematically showing a 3C-SiC crystal on the Si substrate obtained according to embodiment 9 of the present invention.
Figure 15:
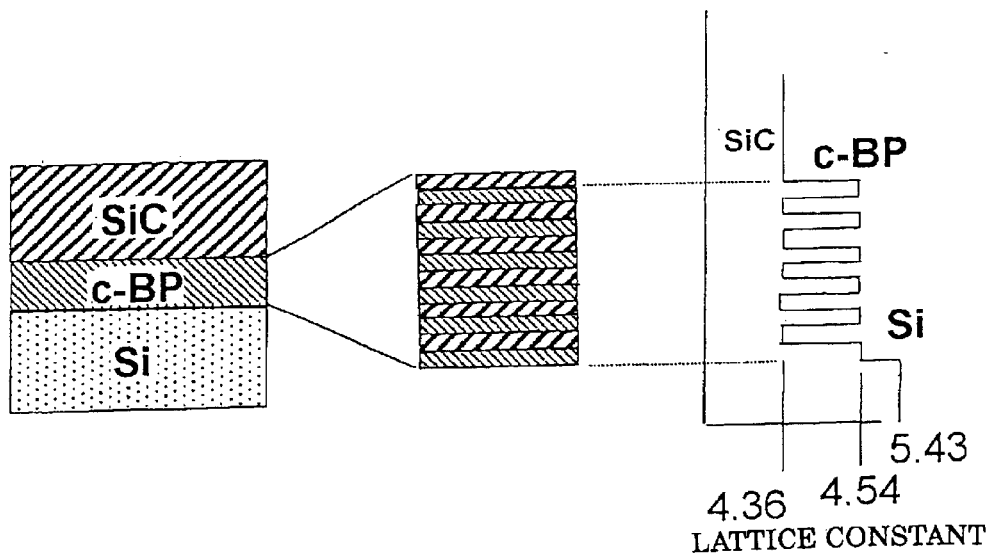
Figure 16:
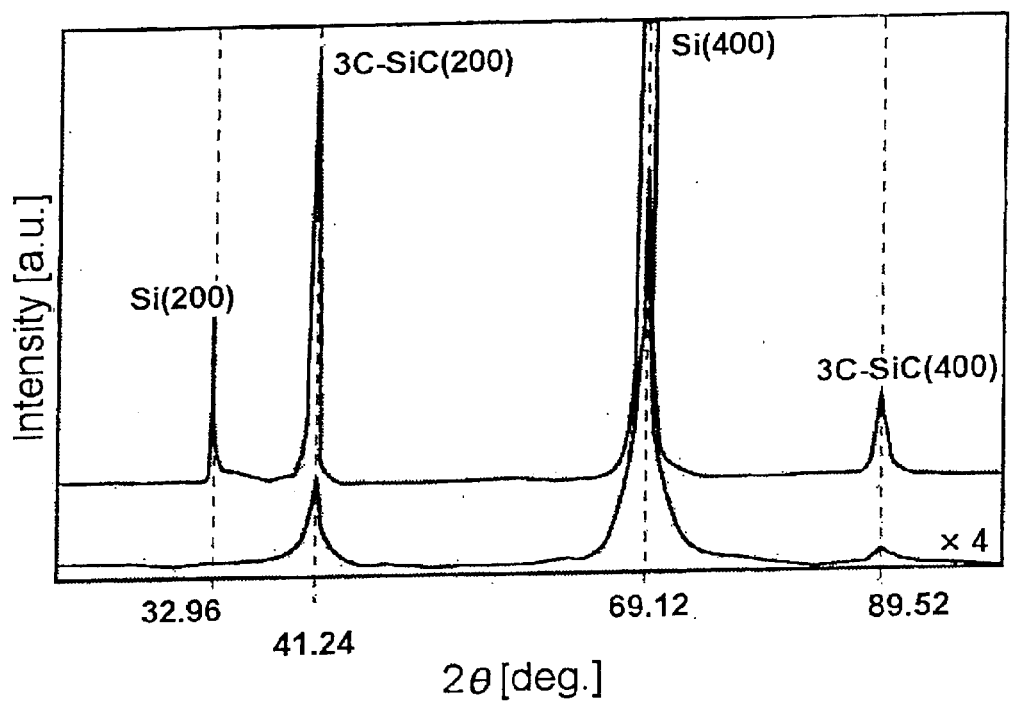
FIG. 16 is a graph showing XRD evaluation results of Si substrates having a buffer layer of multi-layered structure that is obtained according to embodiment 9 of the present invention.

Embodiment 9 embodying the present invention method will be explained with reference to FIGS. 14 through 16.

FIGS. 14(A) and 14(B), respectively, are a plan view and a longitudinal sectional view showing in a simplified manner an example of reaction apparatus suitable for implementing the present invention method.

In the apparatus shown in FIGS. 14(A) and 14(B), reference numeral 21 denotes a reaction vessel circular or rectangular in its longitudinal cross section, and at a starting end side thereof three supply tubes 22a, 22b and 22c for supplying three kinds of gaseous raw materials are disposed in turn from top down. At a dead end side located opposite to the starting end, an exhaust outlet 23 is disposed. Inside of the reaction tube 21, a Si substrate 25 disposed on a susceptor 24 is disposed at a position substantially opposite to openings of the supply tubes 22b and 22c. Below the susceptor 24, a carbon heating element 26 is disposed to heat the Si substrate 25. The susceptor 24 is made rotatable as shown by arrow marks in FIG. 14(B).

In the following, a method for fabricating a beta-SiC film with the apparatus shown in FIG. 14 will be explained.

Into the reaction tube 21, a hydrogen gas is supplied at a rate of 1 L/min from the supply tube 22a, $B_2H_6$ at a rate of 1 cc/min from the water-cooled supply tube 22b, and $PH_3$ at a rate of 1 L/min from the supply tube 22c that incorporates a heating element 22e wound in coil and can control a temperature. The inside of the reaction tube 21 is depressurized to 150 Torr by use of not shown pressure reducing means next to the exhaust outlet 23. In this state, the Si substrate 25 is heated to 300 to 500 degree centigrade with the carbon heating element 26 and maintained there for 10 to 30 min.

On the Si substrate 25, a raw material gas containing a gas having phosphorus element and a gas having boron element is further supplied. Thereby, a cubic boron phosphide single crystal thin film having a thickness of 5 nm or more and 1 $\mu$m or less is synthesized on the Si substrate 25. Into the reaction tube 21, a hydrogen gas is supplied at a rate of 1 L/min from the supply tube 22a, $B_2H_6$ at a rate of 1 cc/min from the water-cooled supply tube 22b, and $PH_3$ at a rate of 1 L/min from the supply tube 22c that can control a temperature by use of the heating element 22e. The inside of the reaction tube 21 is depressurized to 150 Torr and in this state, the Si substrate 25 is heated to 700 to 1100 degree centigrade with the carbon heating element 26 and maintained there for 10 to 30 min.

Onto the Si substrate 25 thereon the cubic boron phosphide single crystal thin film is synthesized, a gas having carbon element and a gas having silicon element are supplied. Thereby, on the cubic boron phosphide single crystal thin film on the Si substrate 25, a beta-SiC single crystal thin film or an amorphous SiC thin film is synthesized in a thickness of 1 nm or more and 100 nm or less. Into the reaction tube, a hydrogen gas is supplied at a rate of 5 L/min from the supply tube 22a and $CH_3SiH_3$ is supplied at a rate of 6 cc/min from the supply tube 22c that can control a temperature with the heating element 22e. The inside of the reaction tube 21 is depressurized to 150 Torr and in this state, the Si substrate 25 is heated to 300 to 700 degree centigrade with the carbon heating element 26 and maintained there for 10 to 30 min.

The Si substrate 25 is annealed at a temperature in the range of 800 to 1200 degree centigrade, and thereby the crystallinity of the previously formed cubic boron phosphide single crystal film is improved.

Onto the Si substrate 25, a gas having carbon element and silicon element is again supplied, and thereby a beta-SiC single crystal thin film having a thickness of 0.1 nm or more and 100 nm or less is synthesized.

Into the reaction tube 21, a hydrogen gas is supplied at a rate of 5 L/min from the supply tube 22a and $CH_3SiH_3$ is supplied at a rate of 6 cc/min from the supply tube 22c that can control a temperature with a heating element 22e. The inside of the reaction tube 21 is depressurized to 0.1 to 1 Torr, and in this state, the Si substrate 25 is heated to 700 to 1200 degree centigrade with the carbon heating element 26 and maintained there for 10 to 120 min.

A series of the processes is repeated at least two times or more, and thereby a cubic boron phosphide single crystal thin film and a beta-SiC single crystal thin film are alternately deposited. Thereby, a multi-layered film having a thickness of 10 nm or more and 10 $\mu$m or less is formed on the Si substrate 25.

Furthermore, a raw material gas containing a gas having carbon element and a gas having silicon element is supplied to the Si substrate 25. A beta-SiC single crystal film having a thickness in the range of 100 nm to 2 $\mu$m is synthesized on the Si substrate 25. Into the reaction tube 21, a hydrogen gas is supplied at a rate of 5 L/min from the supply tube 22a and $CH_3SiH_3$ is supplied at a rate of 6 cc/min from the supply tube 22c that can control the temperature with the heating element 22e. The inside of the reaction tube 21 is depressurized to 0.1 Torr, and in this state, the Si substrate 25 is heated to 800 to 1200 degree centigrade with the carbon heating element 26 and maintained there for 300 min.

A multi-layered film in which a cubic boron phosphide single crystal thin film and a beta-SiC single crystal thin film are alternately deposited on the Si substrate 25 functions as a buffer film (buffer layer) and, because of an improvement of crystallinity of the c-BP layer due to an annealing effect, the crystallinity of the beta-SiC films formed on the respective c-BP films is gradually improved. Thereby, the differences of the lattice constants and the thermal expansion coefficients are effectively alleviated. Furthermore, on the Si substrate 25, a high quality beta-SiC single crystal film in which strain and crystal defects are suppressed as low as possible can be formed.

In the above, examples where the 3C-SiC crystal is formed on the Si substrate are explained. However, the crystal layer formed on the Si substrate can be applied to all compound crystals such as nitrides, oxides and so on including GaN.

A III-V group compound film (GaN and so on) that decomposes at a relatively low temperature can be similarly used. According to the above method, the crystallinity of GaN can be improved. When one of these is used as the buffer layer, the crystallinity of the growth film after that can be improved.

What is claimed is:

1. A semiconductor in which a 3C-SiC layer is epitaxially grown on a surface of a Si substrate with a c-BP (cubic boron phosphide) buffer layer interposed therebetween.

2. A semiconductor as set forth in claim 1:
   wherein the c-BP buffer layer has a thickness in the range of 1 nm to 5 $\mu$m.

3. A semiconductor as set forth in claim 1:
   wherein the 3C-SiC layer has a thickness of 10 $\mu$m or more.

4. A method of fabricating a semiconductor, including:
   when a 3C-SiC layer is epitaxially grown on a Si wafer to be a substrate, interposing c-BP as a buffer layer between the Si wafer and the 3C-SiC layer.

5. A method of fabricating a semiconductor as set forth in claim 4:

wherein raw material gases for use in deposition of c-BP are phosphine and diborane.

6. A method of fabricating a semiconductor as set forth in claim 4:
wherein the 3C-SiC layer is first grown as an amorphous phase according to a low temperature epitaxial growth process followed by a high temperature epitaxial growth process.

7. A method of fabricating a semiconductor as set forth in claim 6:
wherein the 3C-SiC layer, in the low temperature epitaxial growth process, is formed by use of monomethylsilane by means of CVD, and in the high temperature epitaxial growth process, is formed by use of monomethylsilane by means of the CVD or by use of acetylene and silane, or propane and silane, by means of the CVD.

8. A method of fabricating a semiconductor as set forth in claim 4:
wherein the c-BP film is formed in a reduced pressure state.

9. A method of fabricating a semiconductor as set forth in claim 4:
wherein a $Si_3N_4$ layer is formed on a rear surface of the Si substrate.

10. A method of fabricating a semiconductor as set forth in claim 9:
wherein a thickness of the SiC layer is substantially the same as that of the $Si_3N_4$ layer.

11. A method of fabricating a semiconductor, including:
forming a c-BP film as a buffer layer on a Si substrate;
forming on the c-BP film an amorphous SiC film at a low temperature; and
forming thereafter a 3C-SiC film or a c-GaN film according to an epitaxial growth process at a high temperature.

12. A method of fabricating a semiconductor as set forth in claim 11:
wherein the amorphous SiC film is formed at a temperature in the range of 300 to 600 degree centigrade.

13. A method of fabricating a semiconductor as set forth in claim 11:
wherein an amorphous SiC thin film or is formed, and thereon a 3C-SiC thick film or a c-GaN thick film is epitaxially grown.

14. A method of fabricating a semiconductor as set forth in claim 11, further including:
forming a $SiO_2$ layer on a surface of the 3C-SiC layer or the c-GaN layer.

15. A method of fabricating a semiconductor as set forth in claim 14:
wherein a thickness of the $SiO_2$ layer is in the range of two to four times that of the SiC layer.

16. A method of fabricating a semiconductor, including:
depositing c-BP (cubic boron phosphide) as a buffer layer on a Si substrate;
depositing an amorphous SiC film according to an epitaxial growth process on the buffer layer at a temperature lower than that at which SiC crystallizes; and
depositing a 3C-SiC crystal film according to an epitaxial growth process on the amorphous SiC film at a temperature higher than that at which SiC crystallizes.

17. A method of fabricating a semiconductor as set forth in claim 16, further including:
after the amorphous SiC film is formed at a low temperature, a raw material gas is stopped supplying followed by annealing, further followed by forming a 3C-SiC crystal film at a high temperature.

18. A method of fabricating a semiconductor as set forth in claim 16:
wherein the amorphous SiC is deposited at a temperature in the range of 300 to 650 degrees centigrade.

19. A method of fabricating a semiconductor as set forth in claim 17:
wherein after the amorphous SiC film is formed, the amorphous SiC film is annealed at a temperature equal to or less than a deposition temperature of the c-BP.

20. A method of epitaxially growing a SiC film on a Si substrate, including:
(a) supplying a raw material gas containing a gas having P (phosphorus) element and a gas having B (boron) element on a Si substrate, and thereby synthesizing an amorphous BP thin film having a thickness of 5 nm or more and 100 nm or less on the Si substrate;
(b) further supplying a raw material gas containing a gas having P element and a gas having B element on the Si substrate, and thereby synthesizing a cubic boron phosphide single crystal film having a thickness of 5 nm or more and 1000 nm or less on the Si substrate; and
(c) supplying a gas having carbon element and a gas having silicon element on the Si substrate thereon the BP single crystal film is formed, and thereby synthesizing a beta-SiC single crystal film or an amorphous SiC film having a thickness of 1 nm or more and 100 nm or less on the cubic boron phosphide single crystal film on the Si substrate.

21. A method of epitaxially growing a SiC film on a Si substrate as set forth in claim 20, further including:
(d) annealing the Si substrate at a temperature in the range of 800 to 1200 degrees centigrade, and thereby improving the crystallinity of the cubic boron phosphide single crystal film formed in the (b) process.

22. A method of epitaxially growing a SiC film on a Si substrate as set forth in claim 20, further including:
(e) once more supplying a gas having carbon element and silicon element on the Si substrate, and thereby synthesizing a beta-SiC single crystal film having a thickness of 1 nm or more and 100 nm or less.

23. method of epitaxially growing a SiC film on a Si substrate as set forth in claim 20:
wherein a series of the above processes are repeated two times or more, thereby alternately depositing the cubic boron phosphide single crystal film and the beta-SiC single crystal film, and thereby forming a multi-layered film having a thickness of 10 nm or more and 10 $\mu$m or less on the Si substrate.

24. A method of epitaxially growing a SiC film on a Si substrate as set forth in claim 20:
wherein supplying a raw material gas containing a gas having carbon element and a gas having silicon element on the Si substrate, and thereby synthesizing a beta-SiC single crystal film having a thickness of 1 $\mu$m or more on the Si substrate.

* * * * *